(12) United States Patent
Wang et al.

(10) Patent No.: US 9,337,249 B2
(45) Date of Patent: May 10, 2016

(54) OLED DISPLAY PANEL AND METHOD OF MANUFACTURING THE SAME AND DISPLAY APPARATUS

(71) Applicants: Shanghai Tianma AM-OLED Co., Ltd., Shanghai (CN); Tianma Micro-Electronics Co., Ltd., Shenzhen (CN)

(72) Inventors: Guoli Wang, Shanghai (CN); Dayong Huang, Shanghai (CN); Bengang Zhao, Shanghai (CN)

(73) Assignees: Shanghai Tianma AM-OLED Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 0 days.

(21) Appl. No.: 14/301,061

(22) Filed: Jun. 10, 2014

(65) Prior Publication Data
US 2015/0187858 A1 Jul. 2, 2015

(30) Foreign Application Priority Data

Dec. 31, 2013 (CN) .......................... 2013 1 0754193

(51) Int. Cl.
*H01L 27/32* (2006.01)
*H01L 51/52* (2006.01)
*H01L 51/56* (2006.01)

(52) U.S. Cl.
CPC ........ *H01L 27/3276* (2013.01); *H01L 27/3216* (2013.01); *H01L 27/3279* (2013.01); *H01L 51/5265* (2013.01); *H01L 51/5268* (2013.01); *H01L 51/5271* (2013.01); *H01L 51/56* (2013.01); *H01L 27/3211* (2013.01); *H01L 51/5234* (2013.01); *H01L 2227/323* (2013.01); *H01L 2251/558* (2013.01)

(58) Field of Classification Search
CPC . H01L 27/3276; H01L 51/56; H01L 51/5271; H01L 51/5268; H01L 27/3216; H01L 2227/323; H01L 2251/558
See application file for complete search history.

(56) References Cited

U.S. PATENT DOCUMENTS

| | | | |
|---|---|---|---|
| 8,124,962 B2 | 2/2012 | Kang | |
| 2008/0309232 A1* | 12/2008 | Yamamoto | H01L 51/5265 313/505 |
| 2011/0114974 A1 | 5/2011 | Song et al. | |
| 2014/0117334 A1* | 5/2014 | Nakamura | H01L 27/322 257/40 |

FOREIGN PATENT DOCUMENTS

| | | |
|---|---|---|
| CN | 101548409 A | 9/2009 |
| CN | 102362368 A | 2/2012 |
| KR | 1020080104875 A | 7/2009 |

OTHER PUBLICATIONS

Office Action as issued in corresponding Chinese Application No. 201310754193.5, dated Jan. 28, 2016.

* cited by examiner

*Primary Examiner* — Julio J Maldonado
*Assistant Examiner* — Farun Lu
(74) *Attorney, Agent, or Firm* — Alston & Bird LLP (57) ABSTRACT

An Organic Light Emitting Diode (OLED) display panel is disclosed. The display panel includes a substrate, a plurality of power lines disposed on the substrate, and a reflection layer disposed on the power lines, where the reflection layer is electrically connected with the power lines. The display panel also includes an anode disposed on the reflection layer, an optical modulation layer disposed between the reflection layer and the anode, a cathode disposed on the anode, and an organic emitting device layer disposed between the anode and the cathode, where the reflection layer is insulated from the anode, and the OLED display panel is configured to transmit light from a side of the reflection layer away from the substrate.

20 Claims, 8 Drawing Sheets

*FIG. 10*

OLED DISPLAY PANEL AND METHOD OF MANUFACTURING THE SAME AND DISPLAY APPARATUS

CROSS-REFERENCES TO RELATED APPLICATIONS

The present application claims priority to Chinese patent application No. 201310754193.5, entitled "OLED display panel and method of manufacturing the same and display apparatus", filed with the State Intellectual Property Office of People's Republic of China on Dec. 31, 2013, the content of which is incorporated herein by reference in its entirety.

TECHNICAL FIELD

The present invention relates to the field of display technologies and particularly to an OLED display panel and a method of manufacturing the same and a display apparatus.

BACKGROUND OF THE INVENTION

Organic Light Emitting Diode (OLED) display apparatuses are becoming increasingly popular at present.

However, displaying quality of the OLED display apparatus is poor.

BRIEF SUMMARY OF THE INVENTION

One inventive aspect is an Organic Light Emitting Diode (OLED) display panel. The display panel includes a substrate, a plurality of power lines disposed on the substrate, and a reflection layer disposed on the power lines, where the reflection layer is electrically connected with the power lines. The display panel also includes an anode disposed on the reflection layer, an optical modulation layer disposed between the reflection layer and the anode, a cathode disposed on the anode, and an organic emitting device layer disposed between the anode and the cathode, where the reflection layer is insulated from the anode, and the OLED display panel is configured to transmit light from a side of the reflection layer away from the substrate.

Another inventive aspect is a method of manufacturing an Organic Light Emitting Diode (OLED) display panel. The method includes providing a substrate, forming power lines on the substrate, and forming a reflection layer on the power lines, where the reflection layer is electrically connected with the power lines. The method also includes forming an optical modulation layer on the reflection layer, forming an anode on the optical modulation layer, forming an organic emitting device layer on the anode, and forming a cathode on the organic emitting device layer, where the reflection layer is insulated from the anode, and the OLED display panel is configured to transmit light from a side of the reflection layer away from the substrate.

Another inventive aspect is a display apparatus including an OLED display panel. The OLED display panel includes a substrate, a plurality of power lines disposed on the substrate, and a reflection layer disposed on the power lines, where the reflection layer is electrically connected with the power lines. The display panel also includes an anode disposed on the reflection layer, an optical modulation layer disposed between the reflection layer and the anode, a cathode disposed on the anode, and an organic emitting device layer disposed between the anode and the cathode, where the reflection layer is insulated from the anode, and the OLED display panel is configured to transmit light from a side of the reflection layer away from the substrate.

BRIEF DESCRIPTION OF THE DRAWINGS

In order to make the technical solutions in the embodiments of the invention more apparent, the drawings to be used in a description of the embodiments will be briefly introduced below, and apparently the drawings to be described below are merely illustrative of some embodiments of the invention, and those ordinarily skilled in the art can derive from these drawings other drawings without any inventive effort.

DETAILED DESCRIPTION OF THE PREFERRED EMBODIMENTS

In order to make the objects, the technical solutions and the advantages of the invention more apparent, the invention will be further described in details with reference to the drawings. Apparently the described embodiments are only a part but not all of the embodiments of the invention. Based upon the embodiments of the invention here, all of other embodiments derived by those ordinarily skilled in the art without any inventive effort shall come into the scope of the invention.

In the embodiments of the invention, a reflection layer is disposed on power lines and the entire surface of a substrate, the power lines are electrically connected with the reflection layer, where the reflection layer is thick and conductive, due to the reflection layer may be set sufficiently thick (the reflection layer equivalently having a large cross section area), thereby reduce the resistance value (namely, reduce the overall resistance of each display unit); and moreover, each power line is connected with the reflection layer disposed on the entire surface of the substrate, thus voltage levels on the power lines of each display unit will be substantially constant, that is, the voltage drop of the power lines is reduced, thereby avoiding the problem caused by the significant voltage drop across the different display units and improving the display quality.

Meanwhile, the embodiments of the invention not only may avoid the problem of significant voltage drop, but also may increase luminous efficiency to improve the luminance, Specifically, a micro-cavity structure is formed between the reflection layer and cathode, the length of micro-cavity can be suitably determined by adjusting the thickness of an optical modulation layer, and then light in three colors emitted from an emitting layer is maximally resonated respectively, so that light is emitted from the cathode at the highest light intensity, thereby increasing luminous efficiency and improving the luminance; and moreover the required emitting layer can be disposed (formed) by evaporation through three fine alignments in the embodiments, thereby not only ensuring the precision of the fine alignments, but also simplifying the complexity of a process and improving the yield of products.

Figure 1:
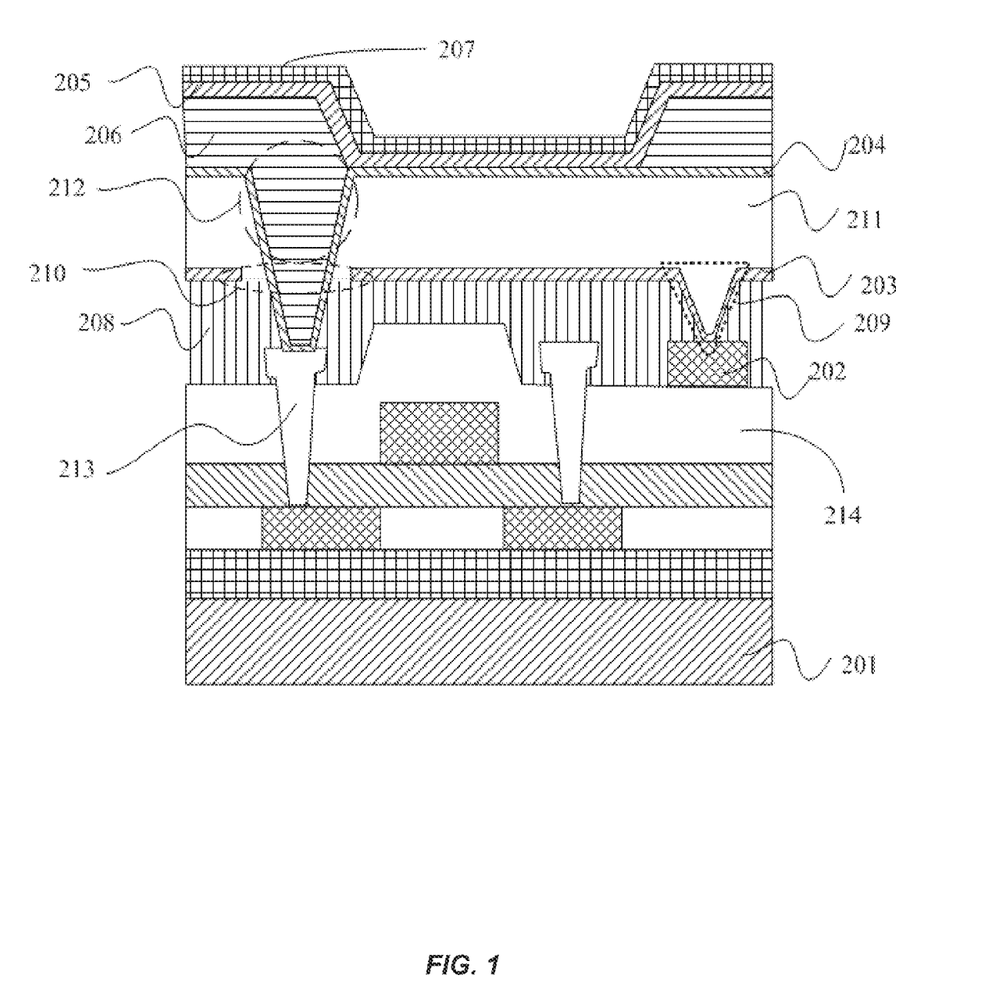
FIG. 1 is a schematic sectional structural diagram of an OLED display panel according to an embodiment of the invention.

It shall be noted that "above" and "on" in "X above Y" or "X on Y" as referred to in the embodiments of the invention, for example, denote only a relationship between the layers, but may not necessarily mean direct coverage of the layers; and "distance" as referred to in the embodiments of the invention denotes "light traveling distance", and a substrate will be exampled as being disposed at the very bottom, as illustrated in FIG. 1.

The inventive solution will be described below in details with reference to particular embodiments thereof, but the invention can include but will not be limited to the following embodiments.

An OLED display panel to be described below according to an embodiment, the OLED display panel is light transmitting on a side of a reflection layer away from a substrate, that is, the OLED display panel is exampled in a top-emitting structure.

FIG. 1 illustrates a schematic sectional structural diagram of an OLED display panel according to an embodiment of the invention, where the OLED display panel includes a substrate 201, power lines 202, a reflection layer 203, an anode 204, an organic emitting device layer 205 and a cathode 207.

Figure 9:
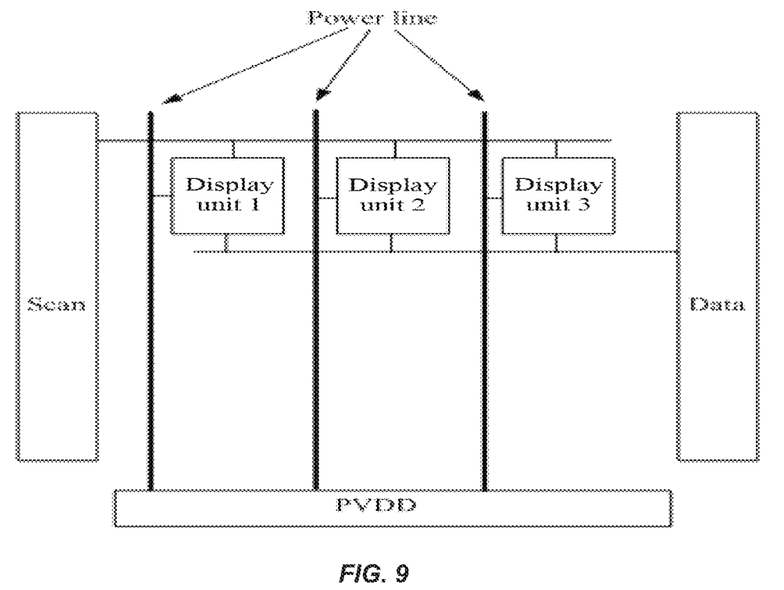
FIG. 9 illustrates a connection relationship between power lines and a power bus PVDD.

The power lines 202 are disposed above the substrate 201, and the power lines 202 are distributed in each display unit, and each power line 202 is connected to a power bus (a connection relationship between power lines and a power bus PVDD shown in FIG. 9).

The reflection layer 203 is disposed on the power lines 202. The reflection layer 203 is electrically connected with the power lines 202 and insulated from the anode 204, where the reflection layer 203 is disposed on the entire substrate 201, and the reflection layer 203 is made of a conductive material with an equivalent resistance less than 100Ω.

In an embodiment of the invention, the reflection layer 203 can be denoted as a square resistor. The square resistor is typically used for a thin film and has a constant resistance, the constant resistance is regardless of the size of the square resistor's area but is determined by the square resistor's thickness (namely, the reflection layer 203 has a constant resistance, and the constant resistance of the reflection layer 203 is determined by the thickness of the reflection layer 203, usually, thickness of the reflection layer 203 is arranged between 200 nm and 2000 nm). Thus a square resistor with an equivalent resistance less than 100Ω may be selected as the reflection layer 203.

The anode 204 is disposed above the reflection layer 203, the cathode 207 is disposed above the anode 204, and the organic emitting device layer 205 is disposed between the anode 204 and the cathode 207, the anode 204 and the cathode 207 are both connected with the organic emitting device layer 205; and furthermore the OLED display panel further includes a pixel defining layer 206 between the organic emitting device layer 205 and the anode 204 to define the display units of the OLED display panel.

The OLED display panel further includes a first insulation layer 208 which is disposed on the power lines 202 and the entire substrate 201, and the first insulation layer 208 includes first via holes 209, each first via hole 209 extends through the first insulation layer 208 to expose the respective power line 202, so that the reflection layer 203 is electrically connected with the power lines 202 through the first via holes 209.

With an increased density of pixels of a display apparatus, that is, an increased number of display units, the number of power lines 202 will also be increased while reducing the line width of the power lines 202, thus the resistance of the power lines 202 will be increased, and then resulting in a greater voltage drop at respective locations along the power lines 202. The reflection layer 203 is electrically connected with the power lines 202 via the first via holes 209, so that the power lines 202 of all the display units are electrically connected to each other through the refection layer 203 disposed on the entire substrate 201. Thus the refection layer 203 disposed on the entire substrate 201 may be regarded as a resistor, and the power lines 202 may be regarded as another resistor connected in parallel with the reflector layer 203, then the overall resistor of the display units (a resistor of parallel connection of the power lines 202 and the refection layer 203) will necessarily be less than the resistor of the reflector layer 203, and there will be an insignificant difference in voltage at the respective locations along the power lines 202, that is, the voltage drop of the power lines 202 is reduced, thereby avoiding the imbalance of display brightness caused by a significant voltage drop.

Since the resistance of the reflection layer 203 is inversely proportional to its thickness, the resistance of the reflection layer 203 may be reduced by increasing the thickness of the reflection layer 203, thereby reducing voltage drop.

In an embodiment of the invention, the reflection layer 203 can adopt a structure of a single layer, and then the reflection layer 203 may be made of metal (namely the reflection layer 203 is one metal layer). Alternatively the reflection layer 203 can adopt a multilayer structure, and then the reflection layer 203 can include a metal layer (not illustrated) and a transparent conductive layer (not illustrated) stacked to the metal layer, and the metal layer may be disposed on a side proximate to the organic emitting device layer 205 and the transparent conductive layer may be disposed on a side proximate to the substrate 201 for reflection.

Regardless of whether the reflection layer 203 adopts a structure of a single layer or a multilayer structure, the metal layer may be made of silver, molybdenum, aluminum, gold, copper, titanium, nickel, iron, chromium and tungsten or an alloy structure consisted of any combination of more than one of silver, molybdenum, aluminum, gold, copper, titanium, nickel, iron, chromium and tungsten; and a particular proportion of the metals constituting the alloy may be set as desired in practice, and a repeated description thereof will be omitted here.

The reflection layer 203 may further include second via holes 210, each second via hole 210 extends through the reflection layer 203, and the OLED display panel further includes an optical modulation layer 211 disposed between the reflection layer 203 and the anode 204, where the optical modulation layer 211 is made of a transparent insulating material, and the optical modulation layer 211 includes third via holes 212, each third via hole 212 extends through the optical modulation layer 211, and each second via hole 210 are in communication with the respective third via hole 212. Furthermore the OLED display panel further includes an array of TFTs disposed on the substrate 201, where an source electrode 213 of the TFT is exposed by the second via hole 210, so that the anode 204 is electrically connected with the source electrode 213 of the TFT through the second via hole 210 and the third via hole 212 in communication with each other. Moreover the projection of the second via hole 210 on the substrate 201 encompasses the projection of the third via hole 212 on the substrate 201, so that the shortcircuit caused by contact of the anode 204 and the reflection layer 203 will be avoided.

Figure 2:
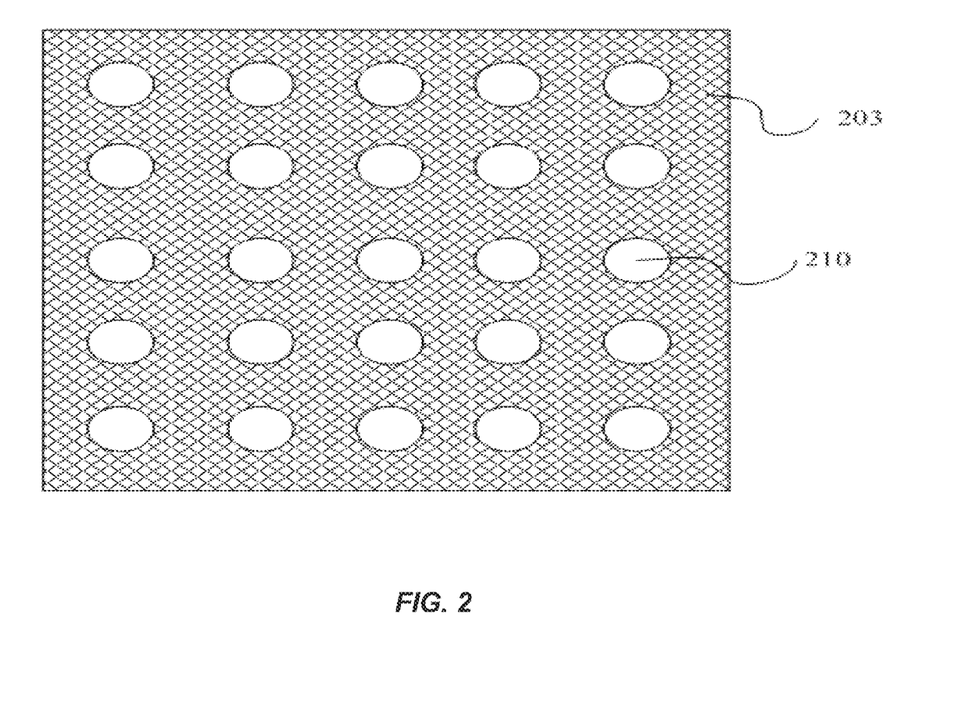
FIG. 2 is a top view of a reflection layer according to an embodiment of the invention.

FIG. 2 is a top view of the reflection layer 203 including a plurality of second via holes 210, and it shall be noted that the second via holes 210 are circular in a plane only as an example without limitation thereto in the solution of the embodiment, and the shape of the second via holes will not be limited in the embodiment of the invention.

In the embodiment of the invention, the reflection layer is disposed on the power lines to have a number of power lines electrically connected with the reflection layer disposed on the entire substrate where the reflection layer is thick and conductive, so that the power lines may be regarded as being connected in parallel with the reflection layer, and thus the overall resistance of each display unit is reduced, and there will be an insignificant difference in voltage at respective locations along the power lines, that is, the voltage drop of the power lines is reduced, thereby avoiding a poor display quality, and particularly avoiding the imbalance of display brightness caused by a significant voltage drop. Furthermore, the reflection layer may also be configured as a mirror of a micro-cavity, and three micro-cavity structures corresponding to three colors R, G and B emitted from the corresponding portion of the emitting layer may be formed through three fine alignments. Thereby ensure that the cavity length of the micro-cavity structure may be adjusted by adjusting the optical modulation layer and the number of fine alignments can be reduced, thus ensuring the precision of the fine alignments and improving the yield of products while simplifying the complexity of a manufacture process. Moreover the optical modulation layer is disposed between the reflection layer and the anode, that is, the optical modulation layer is disposed below the organic emitting device layer, so that no light rays will be blocked by the optical modulation layer while emitted light is transmitted at the cathode side, thereby avoiding a loss of light rays and improving a display effect.

It shall be noted that, the OLED display panel exampled in a top-emitting structure has been described in the above-mentioned embodiment, the conductive reflection layer disposed above the power lines may need to be reflective. In other embodiments, the OLED display panel may be exampled in a bottom-emitting structure, then the reflection layer may be arranged as required so as to make the OLED display panel be light transmitting at a side of the reflection layer proximate to the substrate. The reflection layer as referred to in the above-mentioned embodiments of the invention is applicable to both of the above-mentioned two emitting structures (top-emitting structure and bottom-emitting structure). Since the reflection layer in the bottom-emitting structure is similar to the reflection layer in the top-emitting structure, reference can be made to the solution of the top-emitting structure described above, and a repeated description of a display panel in a bottom-emitting structure will be omitted here.

Further, according to the OLED display panel of above-mentioned embodiments of the invention, another OLED display panel according to an embodiment of the invention will be described below, where the another OLED display panel is structurally the same as the OLED display panel according to the above-mentioned embodiments of the invention except for a change in performance of the structural film layers.

This embodiment will be described below taking the top-emitting structure in FIG. 1 again as an example, but the invention will not be limited to the following embodiment.

As illustrated in FIG. 1, in the OLED display panel, the reflection layer 203 has a reflectivity greater than 90%; and each of the anode 204, the organic emitting device layer 205 and the optical modulation layer 211 has a transmittance greater than 80%, where the refractive index of the optical modulation layer 211 typically be arranged between 1 and 3, and preferably the refractive index of the optical modulation layer 211 is 1.7, and the optical modulation layer 211 may be made of a transparent polymer material or an inorganic material or may be a photo-resist; and the cathode 207 has a specific reflectivity and a specific transmittance, and preferably the transmittance of the cathode 207 is greater than 50%.

Figure 3:
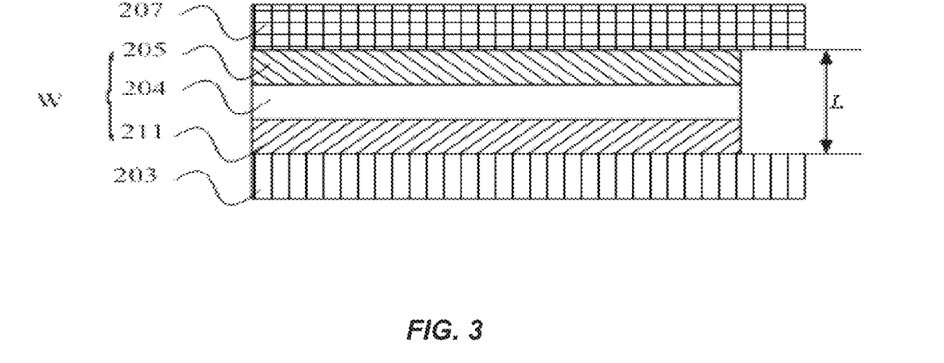
FIG. 3 is a simplified structural diagram of a micro-cavity according to an embodiment of the invention.

Thus, as illustrated in FIG. 3, a micro-cavity structure W including the anode 204, the organic emitting device layer 205 and the optical modulation layer 211 are formed between the cathode 207 and the reflection layer 203, a side surface of the reflection layer 203 proximate to the anode 204 is a mirror of the micro-cavity structure W, and a side surface of the cathode 207 proximate to the anode 204 is another mirror of the micro-cavity structure W, where the cavity length L of the micro-cavity structure W is the sum of the thickness of the optical modulation layer 211, the anode 204 and the organic emitting device layer 205 (that is, the distance between the side surface of the cathode 207 proximate to the anode 204 and the side surface of the reflection layer 203 proximate to the anode 204); and with the cavity length L of the micro-cavity structure W satisfying the equation of:

$$L = \frac{\lambda}{2} N \quad (1)$$

light emitted from the organic emitting device layer 205 of the micro-cavity structure W can be resonated at the highest intensity in the micro-cavity structure W, thereby increasing luminous efficiency and improving the luminance, where L denotes the distance between the side surface of the cathode 207 proximate to the anode 204 and the side surface of the reflection layer 203 proximate to the anode 204; λ denotes the wavelength of the emitted light; and N denotes a positive integer.

Figure 4:
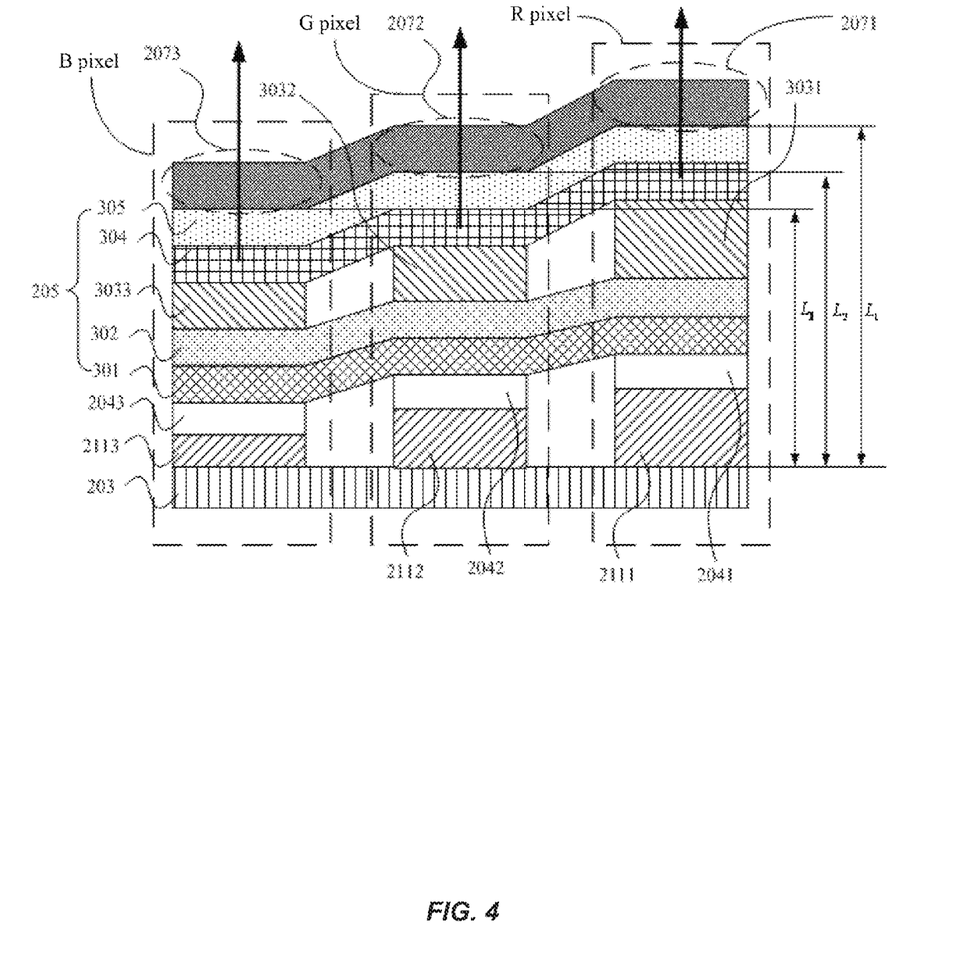
FIG. 4 is a schematic structural diagram of a micro-cavity in a display unit according to an embodiment of the invention.

As illustrated in FIG. 4 which is a schematic diagram of RGB pixels according to an embodiment of the invention, the RGB pixels correspond respectively to light in red, green and blue. It shall be noted that the wavelengths of the light in red, green and blue are different from each other, and the cavity length of the micro-cavity structure described above is wavelength-dependent, so the cavity lengths of the micro-cavity structures corresponding to the R, G and B pixels of the display units for the light in the different colors are also different from each other, namely, cavity length of the micro-cavity structure corresponds to the R pixel, cavity length of the micro-cavity structure corresponds to the G pixel and cavity length of the micro-cavity structure corresponds to the B pixel are different from each other.

Referring to the R pixel (i.e. red pixel), G pixel (i.e. green pixel) and B pixel (i.e. blue pixel), there are included a reflection layer 203, and a first optical modulation layer 2111 corresponding to the R pixel, a second optical modulation layer 2112 corresponding to the G pixel and a third optical modulation layer 2113 corresponding to the B pixel are disposed on the reflection layer 203; a first anode 2041, a second anode 2042 and a third anode 2043 respectively disposed on the respective optical modulation layers (namely, the first anode 2041 is disposed on the first optical modulation layer 2111 and corresponds to the R pixel, the second anode 2042 is disposed on the second optical modulation layer 2112 and corresponds to the G pixel, the third anode 2043 is disposed on the third optical modulation layer 2113 and corresponds to the B pixel); and a first cathode 2071 corresponding to the R pixel, a second cathode 2072 corresponding to the G pixel and a third cathode 2073 corresponding to the B pixel are disposed on an organic emitting device layer 205, the organic emitting device layer 205 is disposed between the anode (the first anode 2041, the second anode 2042 and the third anode 2043) and the cathode (the first cathode 2071, the second cathode 2072 and the third cathode 2073).

The organic emitting device layer 205 includes: a hole injection layer 301 disposed on the anode (the anode includes the first anode 2041, the second anode 2042 and the third anode 2043); a hole transmission layer 302 disposed on the hole injection layer 301; a first emitting layer 3031, a second emitting layer 3032 and a third emitting layer 3033 disposed on the hole transmission layer 302 to respectively emit light in red, green and blue (i.e. the first emitting layer 3031 emits light in red, the second emitting layer 3032 emits light in green, the third emitting layer 3033 emits light in blue); and an electron transmission layer 304 and an electron injection layer 305 sequentially disposed on the emitting layers mentioned above, where the first optical modulation layer 2111 corresponds to light emitted in red (i.e. the first optical modulation layer 2111 corresponds to the first emitting layer 3031 or R pixel), the second optical modulation layer 2112 corresponds to light emitted in green (i.e. the second optical modulation layer 2112 corresponds to the second emitting layer 3032 or the G pixel), and the third optical modulation layer 2113 corresponds to light emitted in blue (i.e. the third optical modulation layer 2113 corresponds to the third emitting layer 3033 or the B pixel), respectively; and where the thickness of the first optical modulation layer 2111 is greater than the thickness of the second optical modulation layer 2112, and the thickness of the second optical modulation layer 2112 is greater than the thickness of the third optical modulation layer 2113.

Correspondingly, the first anode 2041 and the first cathode 2071 correspond to light emitted in red (i.e. the first anode 2041 and the first cathode 2071 corresponds to the first emitting layer 3031 or the R pixel), the second anode 2042 and the second cathode 2072 correspond to light emitted in green (i.e. the second anode 2042 and the second cathode 2072 corresponds to the second emitting layer 3032 or the G pixel), and the third anode 2043 and the third cathode 2073 correspond to light emitted in blue (i.e. the third anode 2043 and the third cathode 2073 corresponds to the third emitting layer 3033 or the B pixel), respectively.

Furthermore, L1 denotes the distance between a side surface of the first cathode 2071 proximate to the first anode 2041 and a side surface of the reflection layer 203 proximate to the first anode 2041, where $$L_1 = \frac{\lambda_1}{2}N,$$

and $\lambda_1$ denotes the wavelength of light in red; L2 denotes the distance between a side surface of the second cathode 2072 proximate to the second anode 2042 and a side surface of the reflection layer 203 proximate to the second anode 2042, where $$L_2 = \frac{\lambda_2}{2}N,$$

and $\lambda_2$ denotes the wavelength of light in green; and L3 denotes the distance between a side surface of the third cathode 2073 proximate to the third anode 2043 and a side surface of the reflection layer 203 proximate to the third anode 2043, where $$L_3 = \frac{\lambda_3}{2}N,$$

and $\lambda_3$ denotes the wavelength of light in blue. L1, L2 and L3 satisfy the inequality of L1>L2>L3 and N is a positive integer. That is, the cavity length L1 of the first micro-cavity structure is greater than the cavity length L2 of the second micro-cavity structure, and the cavity length L2 of the second micro-cavity structure is greater than the cavity length L3 of the third micro-cavity structure, where the first micro-cavity structure corresponds to the R pixel, the second micro-cavity structure corresponds to the G pixel and the third micro-cavity structure corresponds to the G pixel.

With the above-mentioned first, second and third micro-cavity structures, the cavity lengths of the first, second and third micro-cavity structures as illustrated in FIG. 4 may be suitably arranged. In addition to the advantage of avoiding the problem caused by the significant voltage drop, with micro-cavity structure formed by the reflection layer and the cathode, the cavity lengths of the first, second and third micro-cavity structures satisfying a condition may be determined by adjusting the thicknesses of the first, second and third optical modulation layers, and further lights emitted from the first, second and third emitting layers are maximally resonated respectively, so that lights transmitted from the first, second and third cathodes are at the highest light intensity, thereby increasing luminous efficiency and improving the luminance.

In an embodiment of the invention, the organic emitting device layer comprises a first organic emitting device layer, a second organic emitting device layer and a third organic emitting device layer, wherein the first organic emitting device layer corresponds to the R pixel, the second organic emitting device layer corresponds to the G pixel, and the third organic emitting device layer corresponds to the B pixel. The first organic emitting device layer includes the hole injection layer 301, the hole transmission layer 302, the first emitting layer 3031, the electron transmission layer 304 and the electron injection layer 305; the second organic emitting device layer includes the hole injection layer 301, the hole transmission layer 302, the second emitting layer 3032, the electron transmission layer 304 and the electron injection layer 305; and the third organic emitting device layer includes the hole injection layer 301, the hole transmission layer 302, the third emitting layer 3033, the electron transmission layer 304 and the electron injection layer 305. And the first organic emitting device layer, the second organic emitting device layer and the third organic emitting device layer are made equal in thickness. Even with this, the cavity lengths of the first, second and third micro-cavity structures may be adjusted by adjusting the thicknesses of the first, second and third optical modulation layers respectively, thereby achieving the maximum resonant intensification of the emitting light and increasing luminous efficiency to improve the luminance; and the optical modulation layer (first, second and third optical modulation layers) is disposed between the reflection layer and the anode, that is, the optical modulation layer is disposed below the organic emitting device layer, so that no light rays will be blocked by the optical modulation layer while the emitted light is transmitted from the cathode side, thereby avoiding a loss of light rays and improving a display effect.

Another embodiment of the present invention will be described below in details with reference to FIG. 1 and FIG. 5, and it shall be noted that the invention can include but will not be limited to the following embodiment. Light is transmitted by an OLED display panel at a side of a reflection layer away from a substrate.

Figure 5:
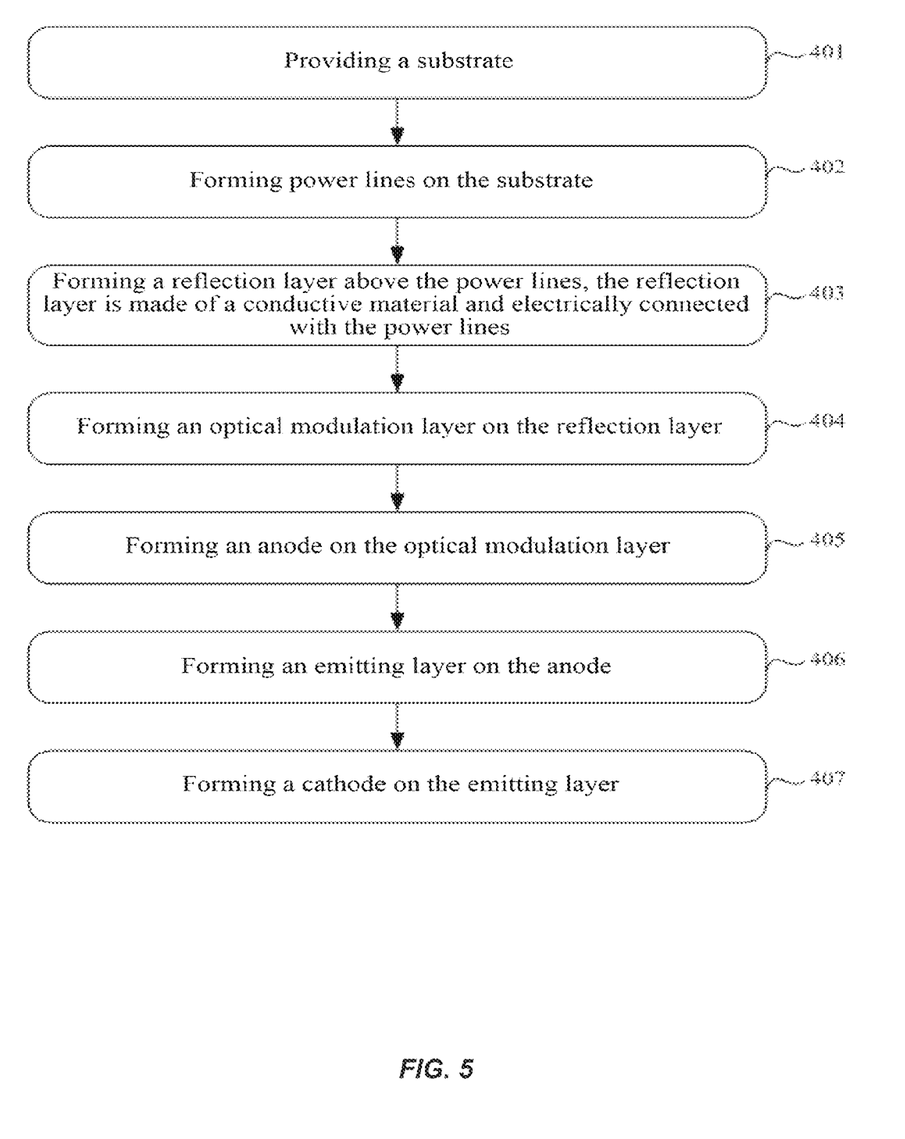
FIG. 5 is a flow chart of a method of manufacturing an OLED display panel according to an embodiment of the invention.

As illustrated in FIG. 1 and FIG. 5, a method of manufacturing an OLED display panel according to an embodiment of the invention includes the following steps 401 to 407:

Step 401: providing a substrate.

Step 402: forming power lines on the substrate.

In this step 402, instead of disposing the power lines 202 directly on the substrate 201, firstly an array of thin film transistors, i.e., an array of TFTs, is disposed on the substrate 201, where the TFT is typically structured in top-gate; and the power lines are formed below each display unit after a passivation layer 214 is deposited. Further, the invention will not be limited to any implementation of manufacturing the power lines but can be any implementation known by skilled in the art.

Step 403: forming a reflection layer on the power lines, the reflection layer is made of a conductive material and electrically connected with the power lines.

After the power lines 202 are formed, a first insulation layer 208 including first via hole 209 is deposited, and the first via hole 209 extends through the first insulation layer 208 to expose the power lines 202. Thereafter the reflection layer 203 is formed through chemical deposition or physical deposition, so that the reflection layer 203 is electrically connected with the power lines 202 through the first via hole 209, where the reflection layer 203 is made of a conductive material.

Since the projection of second via hole 210 on the substrate 201 encompasses the projection of the third via hole 212 on the substrate 201, the reflection layer 203 is insulated from the anode 204 to thereby prevent short-circuiting, where the equivalent resistance of the reflection layer 203 is less than 100Ω.

Step 404: forming an optical modulation layer on the reflection layer.

Step 405: forming an anode on the optical modulation layer.

The anode 204 is formed on the optical modulation layer 211, where the anode 204 is electrically connected with a source electrode of the TFT through the second via hole 210 and third via hole 212, the second via hole 210 and third via hole 212 are in communication to each other.

Step 406: forming an organic emitting device layer on the anode.

The organic emitting device layer 205 is formed on the anode 204 through vapor deposition, wherein the organic emitting device layer 205 includes a pixel defining layer 206.

Step 407: forming a cathode on the organic emitting device layer.

The cathode 207 is formed on the organic emitting device layer 205.

In the embodiment of the invention, the reflection layer is disposed on the power lines and the entire surface of the substrate, the power lines are electrically connected with the reflection layer, where the reflection layer is thick and conductive, and the reflection layer may be set sufficiently thick (equivalently with a large cross section area) to thereby reduce the resistance value; and moreover each power line is connected with the reflection layer disposed on the entire surface of the substrate, so voltage levels on respective locations of each power line of the respective display units will be substantially constant, that is, the voltage drop of the power line is reduced, thereby avoiding the problem caused by the significant voltage drop across the different display units; and moreover the optical modulation layer is disposed between the reflection layer and the anode, that is, the optical modulation layer is disposed below the organic emitting device layer, so that no light rays will be blocked by the optical modulation layer while the emitted light is transmitted from the cathode side, thereby avoiding a loss of light rays and improving a display effect.

Figure 6:
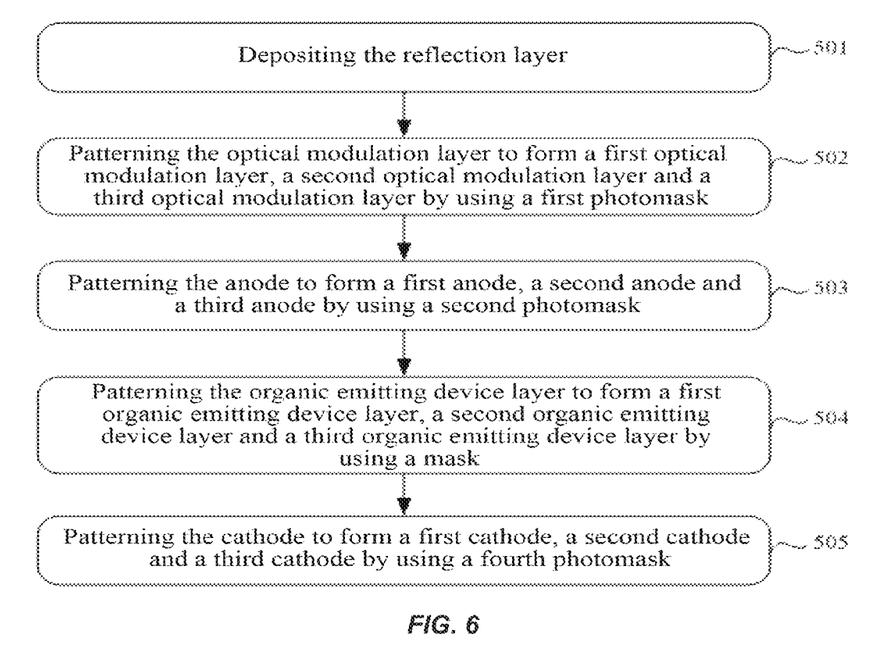
FIG. 6 is a flow chart of a method of manufacturing a micro-cavity structure in a display unit according to an embodiment of the invention.

Another method of manufacturing an OLED display panel according to an embodiment of the invention will be described below, and steps in the another method of manufacturing an OLED display panel are substantially the same as those in the above-mentioned method, so only a method of manufacturing a micro-cavity structure in a display unit according to an embodiment of the invention will be described here with reference to FIG. 4 and FIG. 6. FIG. 6 is a flow chart of a method of manufacturing a micro-cavity structure in a display unit according to an embodiment of the invention. The method includes the following steps 501-505.

Step 501: providing a substrate, and depositing a reflection layer on the substrate.

The reflection layer 203 may adopt a structure of a single layer or a multilayer structure, where the reflection layer 203 may adopt a structure of a single layer, and then the reflection layer 203 may be a metal layer; or in other way, the reflection layer 203 may be a multilayer structure, and then the reflection layer 203 may include a metal layer and a transparent conductive layer stacked to the metal layer, and the metal layer may be disposed on a side proximate to the organic emitting device layer 205 and the transparent conductive layer may be disposed on a side proximate to the substrate 201 for reflection. Regardless of whether the reflection layer adopts a structure of a single layer or a multilayer structure, the metal layer may be made of one of silver, molybdenum, aluminum, gold, copper, titanium, nickel, iron, chromium and tungsten or an alloy structure consisted of any combination of more than one of silver, molybdenum, aluminum, gold, copper, titanium, nickel, iron, chromium and tungsten; and a particular proportion of the metals constituting the alloy may be set as desired in practice.

Step 502: patterning the optical modulation layer to form a first optical modulation layer, a second optical modulation layer and a third optical modulation layer by using a first photomask.

In this step 502, the optical modulation layer may be exposed, developed, etched and subjected to other photolithography processes using a general mask, and may be patterned by using the first photomask to form the first optical modulation layer 2111, the second optical modulation layer 2112 and the third optical modulation layer 2113 shown in FIG. 4 respectively, where the first optical modulation layer 2111 corresponds to R pixel, the second optical modulation layer 2112 corresponds to G pixel, and the third optical modulation layer 2113 corresponds to B pixel, respectively; and the thickness of the first optical modulation layer 2111 is greater than the thickness of the second optical modulation layer 2112, and the thickness of the second optical modulation layer 2112 is greater than the thickness of the third optical modulation layer 2113.

Step 503: forming an anode on the reflection layer, and patterning the anode to form a first anode, a second anode and a third anode by using a second photomask.

In this step 503, the anode may be exposed, developed, etched and subjected to other photolithography processes by using the general mask, and may be patterned by using the second photomask to form the first anode 2041, the second anode 2042 and the third anode 2043 respectively, where the first anode 2041 corresponds to R pixel, the second anode 2042 corresponds to G pixel, and the third anode 2043 corresponds to B pixel, respectively.

The exposure precision of the general mask used in both the patterning processes in the step 502 and the step 503 mentioned-above is not greater than 5 μm.

Step 504: forming an organic emitting device layer on the anode, and patterning the organic emitting device layer to form a first organic emitting device layer, a second organic emitting device layer and a third organic emitting device layer by using a mask.

In this step 504, a difference from the steps mentioned-above is that the organic emitting device layer is formed through vapor-deposition (evaporation) in this step. Firstly a hole injection layer 301 is formed on the respective anodes (the first anode 2041, the second anode 2042 and the third anode 2043) through vapor-deposition using a general alignment mask, secondly a hole transmission layer 302 is formed on the hole injection layer 301 through vapor-deposition using the general alignment mask; and thirdly the first emitting layer 3031, the second emitting layer 3032 and the third emitting layer 3033 are formed respectively on the hole transmission layer 302 through vapor-deposition with three precise alignments using a fine alignment mask. Finally an electron transmission layer 304 and an electron injection layer 305 are formed sequentially through vapor-deposition using the general alignment mask.

Figure 7:
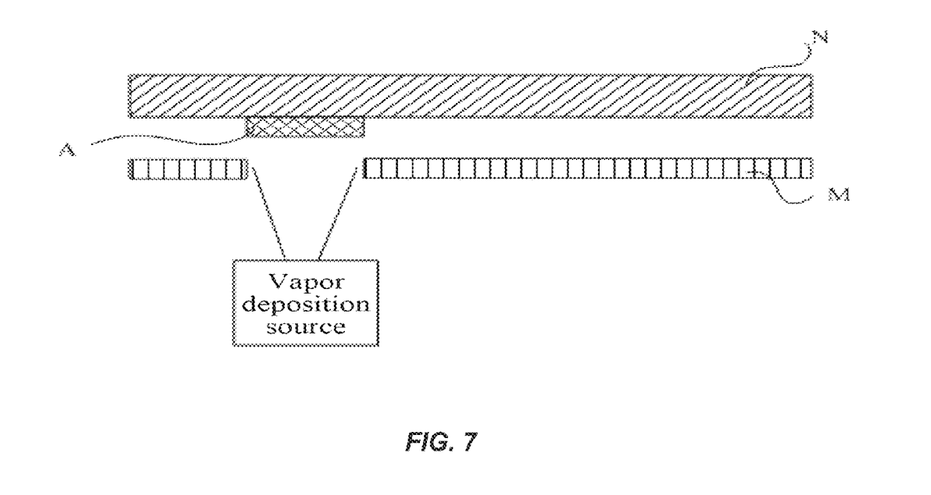
FIG. 7 is a simplified diagram of vapor disposition using a fine alignment mask.

Further, the first organic emitting device layer, the second organic emitting device layer and the third organic emitting device layer equal in thickness can be formed through vapor-deposition with four general alignments (forming of the hole injection layer 301, forming of the hole transmission layer 302, forming of the electron transmission layer 304 and forming of the electron injection layer 305) and three fine alignments (the first emitting layer 3031, the second emitting layer 3032 and the first emitting layer 3033). As illustrated in FIG. 7 which is a simplified diagram of vapor disposition using a fine alignment mask M, the specific thickness of a film layer A as illustrated in FIG. 7 can be determined by controlling a period of time for ejection of film layers, the ejection is performed by a vapor-deposition source after a substrate N is aligned precisely with the fine alignment mask M. Therefore, the thickness of the film layer formed in vapor deposition is decided by the period of time for ejection by the vapor-deposition source.

The precision of the fine alignment is in a range of 1 μm to 2 μm. Since the fine alignment mask needs to be selected by selecting an appropriate fine alignment mask dependent upon the size of a practical display unit, typically, a smaller size of a display unit needs a fine alignment mask with a higher precision of fine alignment. Moreover an alignment operation on a fine alignment mask may be more and more susceptible to an alignment error in a manufacture process of a process flow, and the fine alignment mask may be more difficult than general alignment, thereby reducing the yield of products.

Step 505: forming a cathode on the organic emitting device layers, the cathode includes a first cathode, a second cathode and a third cathode.

The micro-cavity structure as illustrated in FIG. 3 can be manufactured in the manufacture process described above, where the first optical modulation layer 2111, the first anode 2041, the first organic emitting device layer and the first cathode 2071 correspond to R pixel (light emitted in red); the second optical modulation layer 2112, the second anode 2042, the second organic emitting device layer and the second cathode 2072 correspond to G pixel (light emitted in green); and the third optical modulation layer 2113, the third anode 2043, the third organic emitting device layer and the third cathode 2073 correspond to B pixel (light emitted in blue); and moreover, L1 denotes the distance between a side surface of the first cathode 2071 proximate to the first anode 2041 and a side surface of the reflection 203 layer proximate to the first anode 2041, where $$L_1 = \frac{\lambda_1}{2}N$$

and $\lambda_1$ denotes the wavelength of light in red (red light); L2 denotes the distance between a side surface of the second cathode 2072 proximate to the second anode 2042 and a side surface of the reflection 203 layer proximate to the second anode 2042, where $$L_2 = \frac{\lambda_2}{2}N$$

and $\lambda_2$ denotes the wavelength of light in green (green light); and L3 denotes the distance between a side surface of the third cathode 2073 proximate to the third anode 2043 and a side surface of the reflection 203 layer proximate to the third anode 2043, where $$L_3 = \frac{\lambda_3}{2}N$$

and $\lambda_3$ denotes the wavelength of light in blue (blue light), N is a positive integer. L1, L2 and L3 further meet the condition shown as follows: the cavity length L1 of the first micro-cavity structure>the cavity length L2 of the second micro-cavity structure>the cavity length L3 of the third micro-cavity structure.

Therefore, in an embodiment of the invention, with the micro-cavity structure formed as illustrated in FIG. 3, for R pixel, G pixel and B pixel, the cavity length of the micro-cavity structure can be adjusted simply by adjusting thickness of the optical modulation layer, and with the wavelength of the emitting layer determined, an appropriate cavity length can be selected in Equation (1). Typically in a process of manufacturing an TFT array substrate, the hole injection layer 301, the hole transmission layer 302, the electron transmission layer 304 and the electronic injection layer 305 are equal in thickness across the light-emitting areas in R pixel, G pixel and B pixel, and the emitting layers (the first emitting layer 3031, the second emitting layer 3032 and the third emitting layer 3033) may be unequal in thickness across the light-emitting area in R pixel, G pixel and B pixel. Moreover the three emitting layers (i.e. first emitting layer, second emitting layer and third emitting layer) may be manufactured separately due to their different materials, that is, they may be formed through vapor deposition respectively with three fine alignments.

Figure 8A:
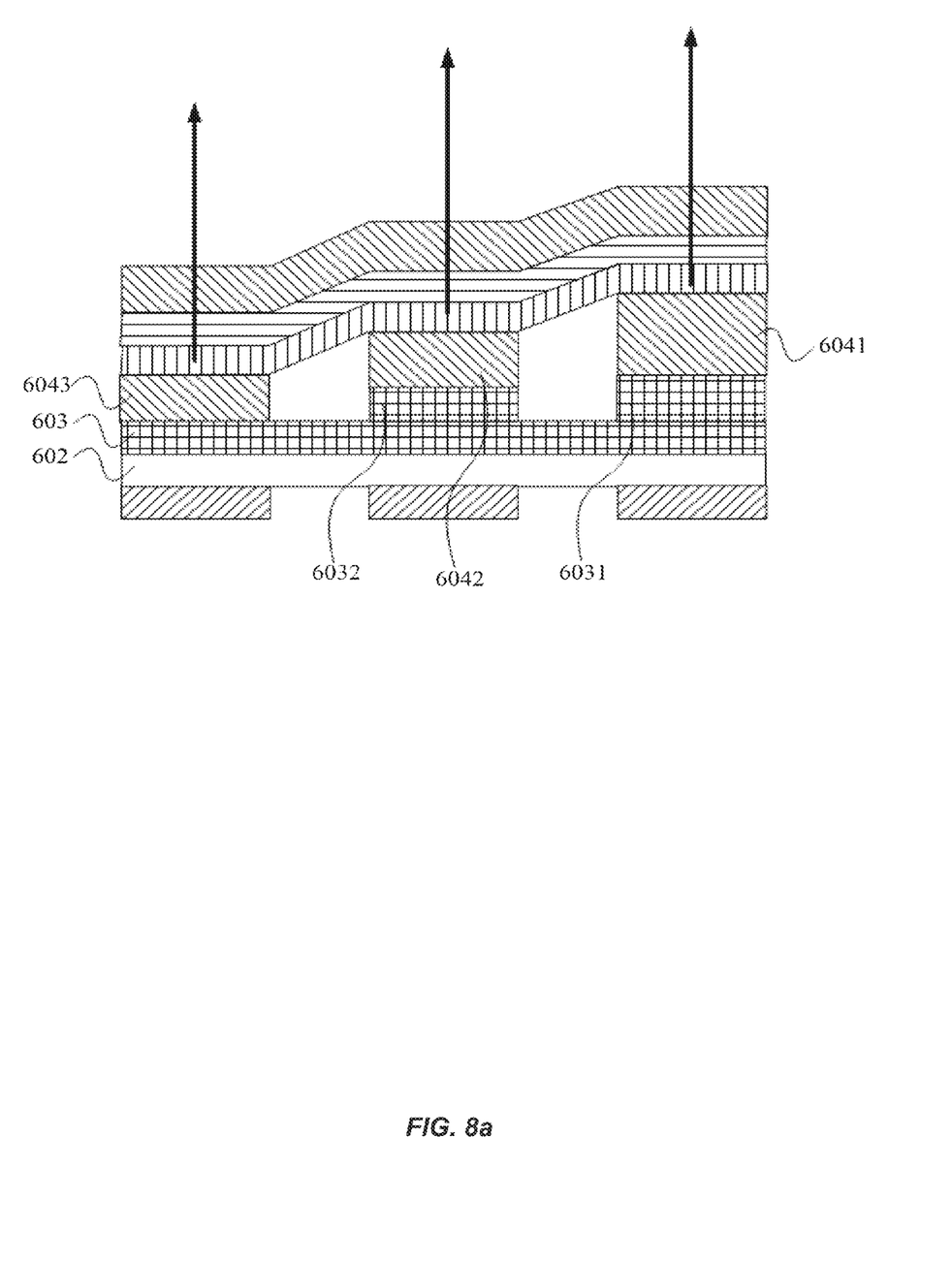
FIG. 8a and FIG. 8b are a diagram of a micro-cavity structure in the prior art and a diagram of a micro-cavity structure according to an embodiment of the invention respectively.
Figure 8B:
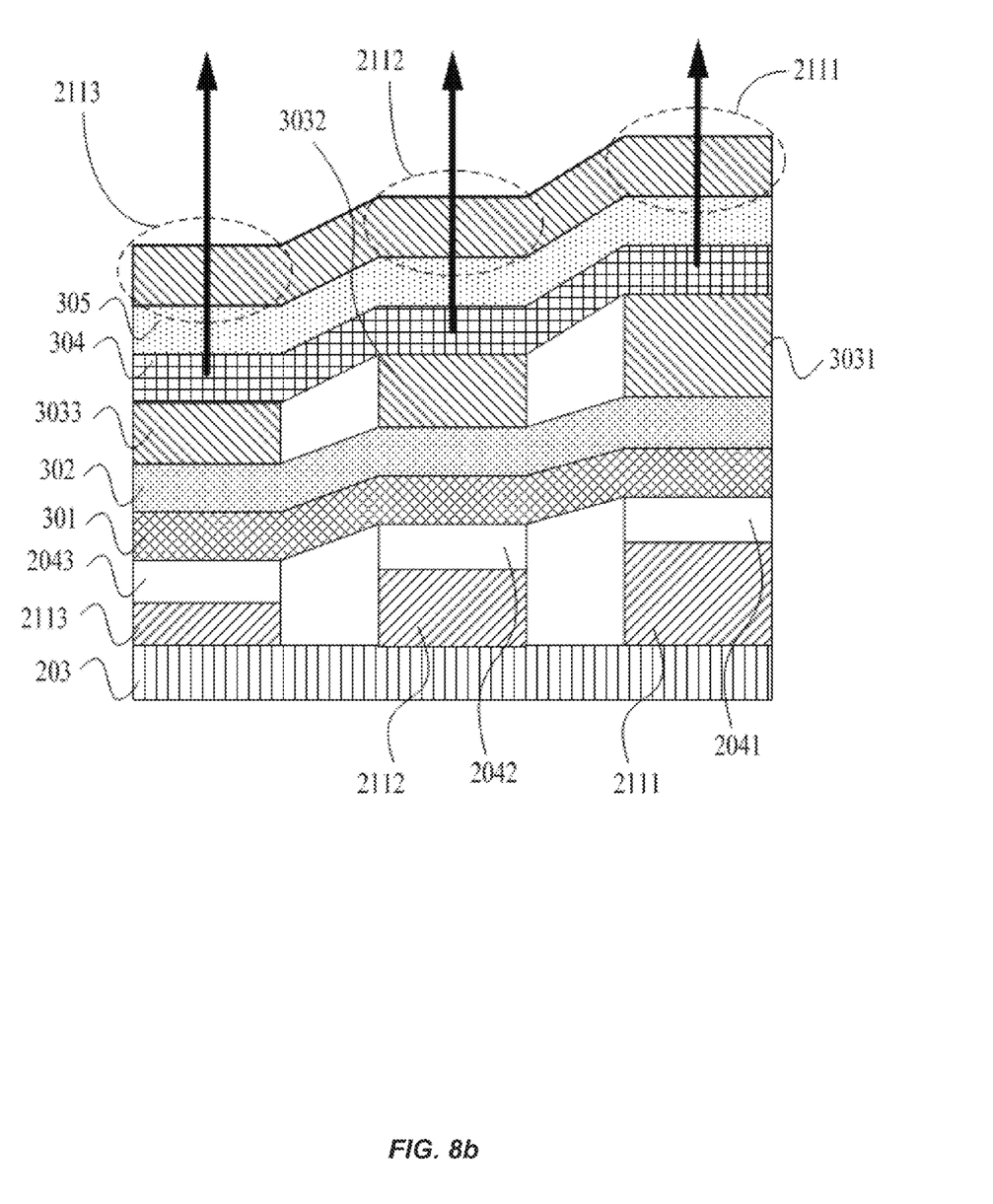

As illustrated in FIG. 8*a* and FIG. 8*b*, FIG. 8*a* is a diagram of a micro-cavity structure in the prior art, and FIG. 8*b* is a diagram of a micro-cavity structure according to an embodiment of the invention.

In FIG. 8a, the cavity length of the micro-cavity structure is the distance between the top surface of the anode and the bottom surface of the cathode, so the micro-cavity structure as illustrated in FIG. 8a has to be formed by forming a hole injection layer 602 through vapor deposition using one general alignment mask, and then forming a hole transmission layer 603 through vapor deposition using one general alignment mask again, and thereafter forming a first hole transmission layer 6031, a second hole transmission layer 6032, a first emitting layer 6041, a second emitting layer 6042 and a third emitting layer 6043 through vapor deposition with five fine alignments respectively. The five fine alignments have to be performed due to different materials and thicknesses of the first hole transmission layer 6031, the second hole transmission layer 6032, the first emitting layer 6041, the second emitting layer 6042 and the third emitting layer 6043. However a greater number of times of fine alignments may result in an increase in complexity of a process and also possibly a degraded alignment precision and a decreased yield of products.

In the embodiment of the inventive solution, the micro-cavity structure as illustrated in FIG. 8b can be formed simply by performing three fine alignments in the steps of the method as illustrated in FIG. 6, and as compared with the solution in FIG. 8a, there will be a less number of times of fine alignments, thereby ensuring the precision of the fine alignments and improving the yield of products while simplifying the complexity of a manufacture process.

Figure 10:
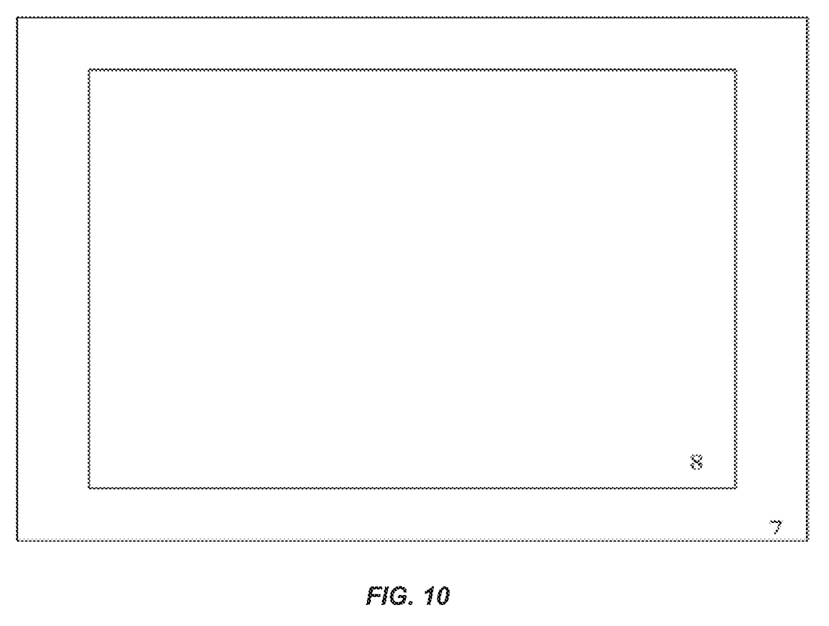
FIG. 10 is a schematic diagram of a display apparatus according to an embodiment of the invention.

Moreover as illustrated in FIG. 10, an embodiment of the invention further provides a display apparatus 7 including an OLED display panel 8, where the OLED display panel 8 is any of the OLED display panels according to the embodiments described above.

In summary, with the OLED display panel and the method of manufacturing the same and the display apparatus according to the embodiments of the invention, the reflection layer is disposed on the power lines to have a number of power lines electrically connected with the reflection layer, where the reflection layer is thick, conductive and disposed on the entire substrate, so that the power lines are connected in parallel with the reflection layer, and thus the overall resistance of each display unit is reduced, and there is an insignificant difference in voltage at the respective locations along the power lines, that is, the voltage drop of the power lines is reduced, thereby avoiding the imbalance of display brightness caused by a significant voltage drop; and further, the reflection layer can also be configured as a mirror of a micro-cavity, and three micro-cavity structures respectively corresponding to R pixel, G pixel and B pixel may be formed as a result of three fine alignments, thereby ensuring that the cavity lengths of the micro-cavity structures may be adjusted simply by adjusting the optical modulation layer and the number of times of fine alignments may be reduced, thus avoiding a degraded precision of the fine alignments and improving the yield of products while simplifying the complexity of a manufacture process. Moreover the optical modulation layer is disposed between the reflection layer and the anode, that is, the optical modulation layer is disposed below the organic emitting device layer, so that no light rays will be blocked by the optical modulation layer while emitted light is transmitted from the cathode side, thereby avoiding a loss of light rays and improving a display effect.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the essence and scope of the invention. Thus the invention is also intended to encompass these modifications and variations thereto so long as the modifications and variations come into the scope of the claims appended to the invention and their equivalents.

What is claimed is:

1. An Organic Light Emitting Diode (OLED) display panel comprising:
   a substrate;
   a plurality of power lines disposed on the substrate;
   a reflection layer disposed on the power lines, wherein the reflection layer is electrically connected with the power lines;
   an anode disposed on the reflection layer;
   an optical modulation layer disposed between the reflection layer and the anode;
   a cathode disposed on the anode; and
   an organic emitting device layer disposed between the anode and the cathode,
   wherein the reflection layer is insulated from the anode, and the OLED display panel is configured to transmit light from a side of the reflection layer away from the substrate.

2. The OLED display panel of claim 1, further comprising a first insulation layer disposed on the power lines, wherein the first insulation layer comprises a plurality of first via holes extending through the first insulation layer to expose the power lines, wherein the reflection layer is electrically connected with the power lines through the first via holes.

3. The OLED display panel of claim 1, wherein at least one of:
   a) the reflection layer is a single metal layer; and
   b) the reflection layer comprises:
      a metal layer, and
      a transparent conductive layer stacked on the metal layer, wherein the metal layer is closer to the organic emitting device layer than the transparent conductive layer.

4. The OLED display panel of claim 1, wherein the thickness of the reflection layer is between 200 nm and 2000 nm.

5. The OLED display panel of claim 1, wherein the reflection layer comprises a plurality of second via holes, and the second via holes extend through the reflection layer.

6. The OLED display panel of claim 5, wherein:
   the optical modulation layer comprises:
      a transparent insulation material such that the reflection layer is insulated from the anode, and
      a plurality of third via holes.

7. The OLED display panel of claim 6, wherein the third via holes extend through the optical modulation layer, the second via holes are aligned with the third via holes, and a projection of the second via holes on the substrate encompasses a projection of the third via holes on the substrate.

8. The OLED display panel of claim 1, wherein a reflectivity of the reflection layer is greater than 90%, transmittances of the anode and the organic emitting device layer are greater than 80%, and transmittance of the cathode is greater than 40%.

9. The OLED display panel of claim 1, wherein transmittance of the optical modulation layer is greater than 80%, and a refractive index of the optical modulation layer is between 1 and 3.

10. The OLED display panel of claim 1, wherein an equivalent resistance of the reflection layer is less than 100Ω.

11. The OLED display panel of claim 1, wherein a distance between a side surface of the cathode proximate the anode and a side surface of the reflection layer proximate the anode satisfies an equation of:

$$L = \frac{\lambda}{2}N,$$

wherein L denotes the distance between the side surface of the cathode proximate the anode and the side surface of the reflection layer proximate the anode; λ denotes a wavelength of emitted light; and N denotes a positive integer.

12. The OLED display panel of claim 11, wherein:
the anode comprises a first anode, a second anode, and a third anode,
the cathode comprises a first cathode, a second cathode, and a third cathode,
the first anode and the first cathode correspond to light emitted in red,
the second anode and the second cathode correspond to light emitted in green,
the third anode and the third cathode correspond to light emitted in blue, and
L1, L2 and L3 satisfy an inequality of L1>L2>L3, wherein:
    L1 denotes a distance between a side surface of the first cathode proximate the first anode and a side surface of the reflection layer proximate the first anode,
    L2 denotes a distance between a side surface of the second cathode proximate the second anode and a side surface of the reflection layer proximate the second anode, and
    L3 denotes a distance between a side surface of the third cathode proximate the third anode and a side surface of the reflection layer proximate the third anode.

13. The OLED display panel of claim 12, wherein:
the optical modulation layer comprises a first optical modulation layer, a second optical modulation layer, and a third optical modulation layer, wherein:
the first optical modulation layer corresponds to light emitted in red,
the second optical modulation layer corresponds to light emitted in green,
the third optical modulation layer corresponds to light emitted in blue,
a thickness of the first optical modulation layer is greater than a thickness of the second optical modulation layer, and
the thickness of the second optical modulation layer is greater than a thickness of the third optical modulation layer.

14. The OLED display panel of claim 13, wherein:
The organic emitting device layer comprises a first organic emitting device layer, a second organic emitting device layer, and a third organic emitting device layer, wherein:
the first organic emitting device layer corresponds to light emitted in red,
the second organic emitting device layer corresponds to light emitted in green, and
the third organic emitting device layer corresponds to light emitted in blue, and the first organic emitting device layer, the second organic emitting device layer, and the third organic emitting device layer are substantially equal in thickness.

15. The OLED display panel of claim 6, further comprising an array of Thin Film Transistors (TFTs) disposed on the substrate, wherein the second via holes expose source electrodes of the TFTs, and the anode is electrically connected with the sources of the TFTs through the second via holes and the third via holes.

16. A method of manufacturing the Organic Light Emitting Diode (OLED) display panel of claim 1, the method comprising:
providing a substrate;
forming power lines on the substrate;
forming a reflection layer on the power lines, wherein the reflection layer is electrically connected with the power lines;
forming an optical modulation layer on the reflection layer;
forming an anode on the optical modulation layer;
forming an organic emitting device layer on the anode; and
forming a cathode on the organic emitting device layer,
wherein the reflection layer is insulated from the anode, and the OLED display panel is configured to transmit light from a side of the reflection layer away from the substrate.

17. The method of claim 16, further comprising:
patterning the optical modulation layer to form a first optical modulation layer, a second optical modulation layer, and a third optical modulation layer using a first photomask,
patterning the anode to form a first anode, a second anode, and a third anode using a second photomask, and
patterning the organic emitting device layer to form a first organic emitting device layer, a second organic emitting device layer, and a third organic emitting device layer using a third photomask, wherein:
the cathode comprises a first cathode, a second cathode, and a third cathode,
the first optical modulation layer, the first anode, the first organic emitting device layer, and the first cathode correspond to light emitted in red,
the second optical modulation layer, the second anode, the second organic emitting device layer, and the second cathode correspond to light emitted in green, and
the third optical modulation layer, the third anode, the third organic emitting device layer, and the third cathode correspond to light emitted in blue, and
L1, L2 and L3 satisfy an inequality of L1>L2>L3, wherein:
    L1 denotes a distance between a side surface of the first cathode proximate the first anode and a side surface of the reflection layer proximate the first anode,
    L2 denotes a distance between a side surface of the second cathode proximate the second anode and a side surface of the reflection layer proximate the second anode, and
    L3 denotes a distance between a side surface of the third cathode proximate the third anode and a side surface of the reflection layer proximate the third anode.

18. The method of claim 17, wherein a thickness of the first optical modulation layer is greater than a thickness of the second optical modulation layer, and the thickness of the second optical modulation layer is greater than a thickness of the third optical modulation layer.

19. The method of claim 18, wherein the first organic emitting device layer, the second organic emitting device layer, and the third organic emitting device layer are substantially equal in thickness.

20. A display apparatus comprising an OLED display panel, wherein the OLED display panel comprises:
- a substrate;
- a plurality of power lines disposed on the substrate;
- a reflection layer disposed on the power lines, wherein the reflection layer is electrically connected with the power lines;
- an anode disposed on the reflection layer;
- an optical modulation layer disposed between the reflection layer and the anode;
- an cathode disposed on the anode; and
- an organic emitting device layer disposed between the anode and the cathode,
- wherein the reflection layer is insulated from the anode, and the OLED display panel is configured to transmit light from a side of the reflection layer away from the substrate.

* * * * *